United States Patent [19]
Newman

[11] Patent Number: 5,357,672
[45] Date of Patent: Oct. 25, 1994

[54] METHOD AND SYSTEM FOR FABRICATING IC PACKAGES FROM LAMINATED BOARDS AND HEAT SPREADER

[75] Inventor: Keith G. Newman, Sunnyvale, Calif.

[73] Assignee: LSI Logic Corporation, Milpitas, Calif.

[21] Appl. No.: 106,026

[22] Filed: Aug. 13, 1993

[51] Int. Cl.⁵ .......................... H05K 3/36; H05K 3/46
[52] U.S. Cl. ........................................ 29/830; 29/417; 29/DIG. 40
[58] Field of Search ................. 29/412, 415, 417, 827, 29/829, 830, 831, 846, 738, DIG. 40; 174/16.3, 52.2, 252; 439/487, 932; 361/412, 413, 414; 257/713, 717

[56] References Cited

U.S. PATENT DOCUMENTS

| | | |
|---|---|---|
| 3,590,480 | 7/1971 | Johnson, Jr. ................... 174/52.2 X |
| 4,618,739 | 10/1986 | Theobald . |
| 4,737,395 | 4/1988 | Mabuchi et al. . |
| 4,773,955 | 9/1988 | Mabuchi et al. . |
| 4,780,957 | 11/1988 | Shiga et al. ...................... 29/830 X |
| 4,785,533 | 11/1988 | Seino et al. ............................ 29/827 |
| 4,835,598 | 5/1989 | Higuchi et al. . |
| 4,868,349 | 9/1989 | Chia . |
| 4,868,638 | 9/1989 | Hirata et al. . |
| 4,890,152 | 12/1989 | Hirata et al. . |
| 4,899,439 | 2/1990 | Potter et al. ..................... 361/414 X |
| 4,916,260 | 4/1990 | Broaddus et al. ................ 29/846 X |
| 5,102,829 | 4/1992 | Cohn . |
| 5,108,955 | 4/1992 | Ishida et al. . |
| 5,124,884 | 6/1992 | Yazu et al. ..................... 174/16.3 X |

*Primary Examiner*—Peter Dungba Vo
*Attorney, Agent, or Firm*—Honigman Miller Schwartz and Cohn

[57] ABSTRACT

A method and system for producing a plurality of integrated circuit packages having heat spreaders attached thereto. A planar metal sheet having predefined openings allows the addition of discrete bypass capacitors to the integrated circuit package. The planar metal sheet laminates to a plurality of laminated printed wiring boards. The metal sheet is then cut into sections resulting in individual packages. Each package has a cavity in which an integrated circuit die is placed therein. The integrated circuit die is in close thermal communication with the heat spreader of the package and connects to the conductive paths of the printed wiring boards. The invention is especially advantageous in manufacturing in quantity plastic pin grid array (PPGA) and plastic ball grid array (PBGA) integrated circuit packages.

9 Claims, 6 Drawing Sheets

METHOD AND SYSTEM FOR FABRICATING IC PACKAGES FROM LAMINATED BOARDS AND HEAT SPREADER

BACKGROUND OF THE INVENTION

1. Field of the Invention

This invention relates generally to fabrication of integrated circuit packages, and in particular, to fabrication of a plurality of integrated circuit packages having coplanar heat sinks attached thereto.

2. Description of the Related Technology

Integrated circuits have revolutionized the field of electronics by making possible a level of technological sophistication unknown in the days of vacuum tubes and even discrete transistors. An integrated circuit die may comprise, on a small silicon chip, many thousands or even a million or more transistors interconnected together to form complex electronic functions. The complex electronic functions of the integrated circuit chip my require several hundred external connections to a related electronic system.

Simple function integrated circuits have been packaged in ceramic packages for high reliability industrial and military applications, and in lower cost molded plastic packages for commercial and consumer products. Recently, very large scale integration (VLSI) integrated circuits have outgrown the connection capacity of either the ceramic or molded plastic packaging systems. The integrated circuit packaging industry has developed more sophisticated packages for VLSI integrated circuits that accommodate the increased number of external connections required to the electronic system.

Several of the VLSI integrated circuit packages having high connection capacity are a plastic pin grid array (PPGA) and a plastic ball grid array (PBGA). The PPGA and PBGA packages differ from the prior molded plastic or ceramic packages in that the PPGA and PBGA are, in effect, miniature multiple layer printed circuit boards having the integrated circuit chip contained within the multiple layers and connected to the various conductive paths of the printed circuit boards.

Interconnections are made between conductors of the different board layers by plated through holes or "vias". The thickness of the boards laminated together limits the size of the interconnection vias. The thicker the laminated boards or overall lamination thickness, the larger must be the diameter of the vias. In complex integrated circuit packages, many hundred interconnections are required. Thus, it is preferable to make the via diameter as small as practical so that interconnecting conductive traces may be routed within the package.

The various layers of printed circuit or wiring boards may be laminated together using adhesive or bonding sheets made up of "B-stage" or "prepreg" material placed between the wiring boards. The wiring board may be comprised of C-stage material. C-stage material is a high temperature glass fiber reinforced epoxy laminate. B-stage is an intermediate stage in the reaction of thermosetting resin in which the material softens when subject to pressure and heat but does not entirely fuse. The B-stage material typically is of the same type of material as is the C-stage material, but only in a partially cured state.

The PPGA and PBGA differ mainly in that the PPGA utilizes conductive metal pins that may be either soldered to a system printed circuit board or inserted into a matching socket which is already soldered to the system printed circuit board. The PBGA utilizes solder "balls" instead of metal pins. The PBGA solder balls reflow to connection points on a printed circuit board when heated to a certain temperature, thus electrically connecting the circuitry within the PBGA integrated circuit package to the electronic system.

The PPGA and PBGA packages, including adaptations thereof for surface mount and hybrid applications, utilize a plurality of multi-layer printed wiring board (PWB) planar substrates made up, for example, of polyimide, glass reinforced epoxy, or other materials known to those skilled in the art of fabricating very large scale integrated circuit packages. Some of the planar substrates have material cut out from the middle, and when laminated together, form a cavity in which the integrated circuit die may be placed.

After the integrated circuit die is installed in the package, connections are made to the die connection pads and the conductive metal patterns of one or more of the planar substrates. The planar substrate metal patterns also connect to either the connection pins or connection solder balls of the PPGA or PBGA package, respectively. Thus, the PPGA or PBGA package is a miniature multi-layer printed circuit board system containing the integrated circuit die and forming a housing for and protection of the die. The die is further protected by encapsulating it with plastic or epoxy material. Examples of integrated circuit fabrication for VLSI integrated circuit packages are more fully illustrated in co-pending patent application Ser. No. 07/917,894 entitled "Ball Bump Grid Array Semiconductor Packages" by Michael Rostoker, Chok J. Chia, Mark Schneider, Michael Steidl, Edwin Fulcher and Keith Newman, filed on Jul. 21, 1992 and incorporated by reference herein for all purposes.

The complex circuitry of sophisticated integrated circuit chip dice generate heat which must be dissipated or else thermal destruction may result. Encapsulation of the chip die, wherein additional plastic material is molded around the chip, further exasperates efficient heat dissipation. A heat spreader or heat sink made of thermally conductive material such as, for example, copper, copper tungsten, ceramics, thermally conductive filled polymers, or aluminum has been incorporated with the integrated circuit package.

The heat spreader is normally attached in close proximity with a major face of the integrated circuit die and is in thermal communication therewith. This heat spreader is adapted to conduct heat from the circuitry of the die by thermal convection and/or conduction. The heat spreader may be a lead frame used to connect the integrated circuit die to external circuits, or may be a separate metal plate that is part of the integrated circuit package. In the higher power dissipation integrated circuits, a metal plate, attached to a major face of the die, is utilized. An additional heat spreader/heat sink may be attached to the metal plate to increase the heat dissipating surface area for more efficient heat transfer.

Accordingly, it is desirable to provide a method and system for simply and cost efficiently manufacturing large scale integrated circuit packages having integral heat spreaders on which integrated circuit dice are attached thereto.

SUMMARY OF THE INVENTION

Accordingly, it is an object of the present invention to provide an improved method and system for manufacturing a plurality of integrated circuit packages having integral heat spreaders.

Another object of the present invention is to minimize manufacturing waste by detecting defective planar substrate assemblies before attachment to a heat spreader panel.

A further object is to minimize fabrication steps in the assembly of integrated circuit packages having integral heat spreaders.

Yet another object is to improve coplanarity of the integrated circuit package.

Yet a further object is to minimize the thickness of the printed wiring board layers.

Still another object is to improve the ease of adding discrete components such as bypass capacitors and removal of unwanted solder flux therefrom.

Another object is to improve thermal conductivity and heat dissipation of an integrated circuit package.

The present invention accomplishes these objects, in addition to other objects that will be described in the drawings and detailed specification below.

The present invention comprises a method and system of manufacturing a plurality of integrated circuit packages having heat spreaders attached thereto. The plurality of integrated circuit packages are cut from a panel consisting of a plurality of planar printed wiring board (PWB) panels and a heat spreader panel all laminated together. After lamination and testing, individual integrated circuit packages are cut from the laminated panel. Each package has a body having a cavity in which an integrated circuit die is placed therein. The die is electrically connected to the PWB conductive paths by, for example, wire bonding. The PWB conductive paths connect to external metal pins or solder balls. Encapsulation covers the die and connections thereto for protection thereof.

According to one aspect of the invention, the laminated planar printed wiring board (PWB) panels are tested before being laminated to a heat spreader panel. If a sufficient number of integrated circuit packages test properly, then the PWB panel is laminated to the heat spreader panel, otherwise the PWB panel may be discarded. After laminating the tested PWB panel to the heat spreader panel, the panel is cut into sections. Each section becomes one integrated circuit package having an inside face formed by the heat spreader layer section and a cavity within the laminated PWB body. An integrated circuit die is placed into the cavity of the package and attaches to the inside face of the heat spreader. The die is electrically connected within the PWB body to connection pads which ultimately connect to external pins or solder balls. After all electrical connections are made, the die is protectively encapsulated. The PWB body, heat spreader and die encapsulation result in the desired integrated circuit package.

According to another aspect of the present invention, a heat spreader panel is laminated to a plurality of printed wiring board panels. A first layer panel of the plurality of printed wiring boards is laminated to the heat spreader panel. A second layer panel of the plurality of printed wiring boards is laminated to the first layer panel. A third layer panel of the plurality of printed wiring boards is laminated to the second layer panel. Any number of layers of panels may be so laminated together. The plurality of printed wiring board panels may be alternately layered with B-staged adhesive layers, compressed and cured as is well known to those in the art of fabricating multi-layer printed circuit boards.

The plurality of printed wiring board panels have material selectively removed so that cavities are formed when the boards are laminated together. After the heat spreader panel and all layers of planar panels are laminated together, sections of the laminated panels may be cut therefrom. Each section is one integrated circuit package assembly ready for attachment of an integrated circuit chip die to an inside face of the heat spreader. Integrated circuit dies are then placed within each cavity of the package assembly. After the die is attached to the heat spreader of the package assembly, the die is electrically connected to the printed wiring paths which are in turn connected to the external metal pins or solder balls of the integrated circuit package. The die is encapsulated in the assembly, resulting in an integrated circuit package.

According to another aspect of the invention, openings are placed in the heat spreader panel. These openings may be of any shape such as, for example, round, elliptical, square, rectangular, etc. These openings are positioned in the heat spreader panel so that when sections are cut therefrom, the openings are over connection pads of a printed wiring board. The exposed connection pads may be used to connect discrete components such as, for example, decoupling capacitors. The openings are placed in the heat spreader panel such that when the sections are cut therefrom, a side of each opening is open at the perimeter edge of each section. The open side of the opening makes attachment of discrete components to the printed wiring board easier and removal of solder flux therefrom more effective.

According to another aspect of the invention, the heat spreader panel has a solder mask placed thereon. The solder mask is used to allow selected areas of the heat spreader panel to be plated. This plating may be metal such as, for example, nickel, nickel-gold, or gold. Gold is preferable for protecting the exposed area of the heat spreader from corrosion and as a thermal conductor. The plating may also be utilized for improved attachment of the integrated circuit die thereto and improved thermal conduction therefrom. Plating on both sides of the heat spreader panel may be utilized. Plating on the opposite face of the heat spreader from which the die is attached allows improved attachment of the heat spreader to additional heat sinks. Passivation of the metal surface may also be utilized to prevent corrosion to the underlying metal.

According to another aspect of the invention, the solder mask on the heat spreader may be utilized to improve lamination adhesion of the first planar printed wiring board. It is well known in the art of laminating to improve adhesion of glass epoxy or B-stage polymers to solder masks or passivated surfaces of metal.

Other and further objects, features and advantages will be apparent from the following description of a presently preferred embodiment of the invention, given for the purpose of disclosure and taken in conjunction with the accompanying drawings.

DETAILED DESCRIPTION OF A PREFERRED EMBODIMENT

Reinforced epoxy resin laminate semiconductor device assemblies typically use a discrete heat spreader or "heat slug" which is either embedded into the laminate of the package, or attached to the package by any combination of adhesive, solder or plating. The present invention is a method and system for fabricating semiconductor device assemblies, such as integrated circuit packages, having heat slugs integral thereto. The present invention utilizes a panel comprising a plurality of heat slugs that is cut into sections resulting in a plurality of individual heat slugs attached to respective finished packages.

Figure 1:
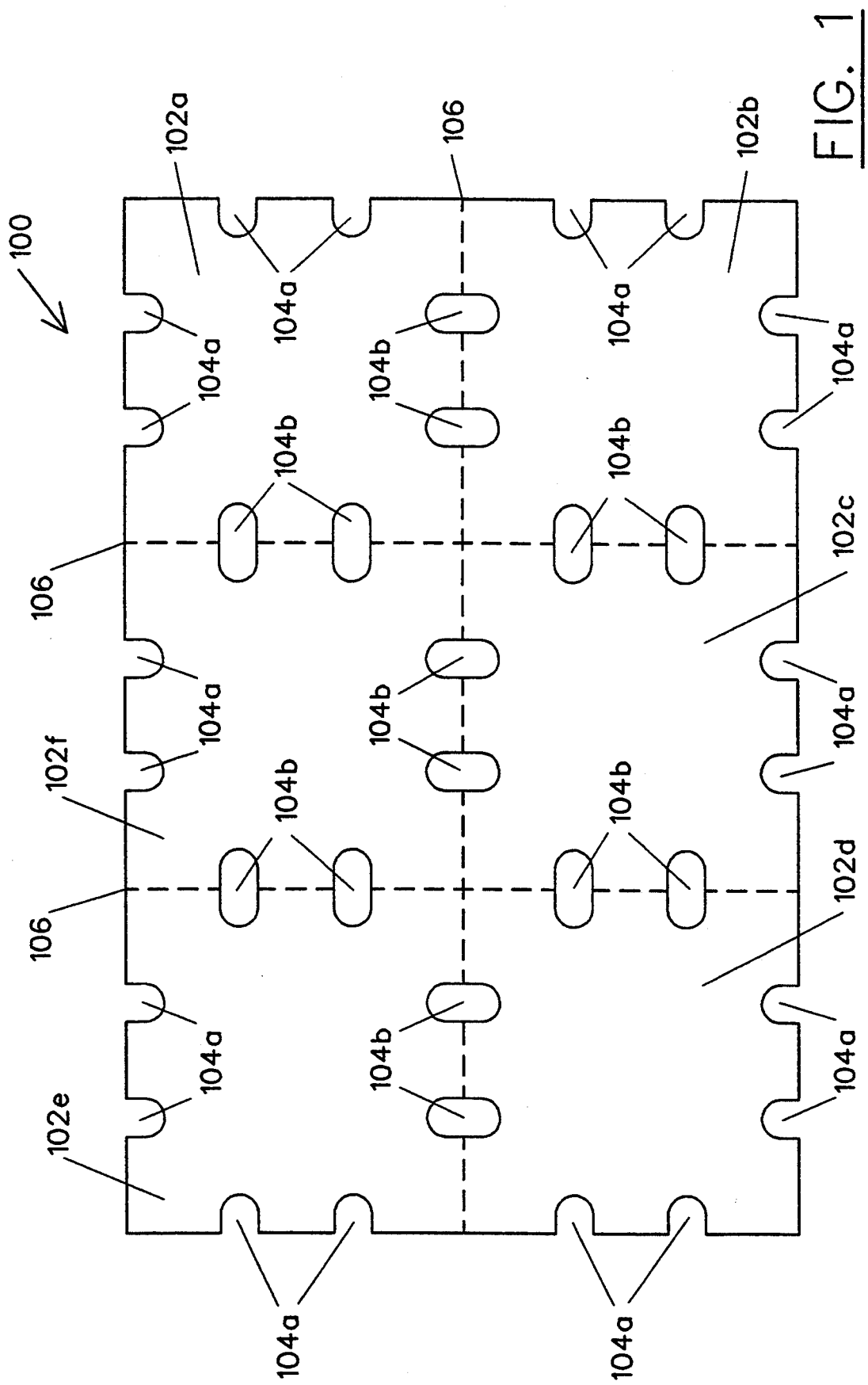
FIG. 1 is a schematic top view of a preferred embodiment of a panel of full metal heat slugs.

Referring now to the drawings, the details of a preferred embodiment are schematically illustrated. In the drawings like elements have the same number, while similar elements have the same number with a suffix having a different lower case letter. Referring to FIG. 1, a heat slug panel is illustrated in schematic plan view. Heat slug panel 100 consists of thermally conductive material such as, for example, copper or aluminum. Other thermally conductive materials that are not metal, such as, for example, aluminum nitride or thermally conductive filled polymers may also be utilized for the heat slugs. A plurality of heat slugs may be obtained from the heat slug panel 100 by cutting sections therefrom.

Individual heat slugs 102a through 102f are illustrated as being contained in the heat slug panel 100. For illustrative purposes only, six heat slugs are illustrated, but any number of heat slugs 102 are possible depending on the size of the heat slug panel 100. Typical sizes for the heat slug panel 100 may be, for example, 12 inches by 12 inches or 12 inches by 24 inches. The heat slugs 102 may be cut from the heat slug panel 100 by sawing, routing, punching, or other means known to those skilled in the art of printed wiring boards. Typically, a heat slug 102 may be about from 0.75 to 2 inches square, thus several dozens of slugs 102 are possible from a typical heat slug panel 100.

The use of cut-outs or "openings" in the heat slug panel 100 accommodate externally mounted devices such as, for example, surface mount chip capacitors on the semiconductor device assembly package. By positioning openings at the cut points 106, the number of cut-outs 104 required is reduced because adjacent packages share the same cutout with a corresponding reduction in the amount of material removed. This reduction in the amount of material removed for the cut-outs 104 improves the heat slug panel 100 stiffness.

The cut-outs 104a have one side open and cut-outs 104b have one side open after cutting the heat slugs 102 from the heat slug panel 100. These openings aid in the removal of any residual solder flux from the chip capacitor attachment process (see FIG. 4, capacitors 402).

Figure 2:
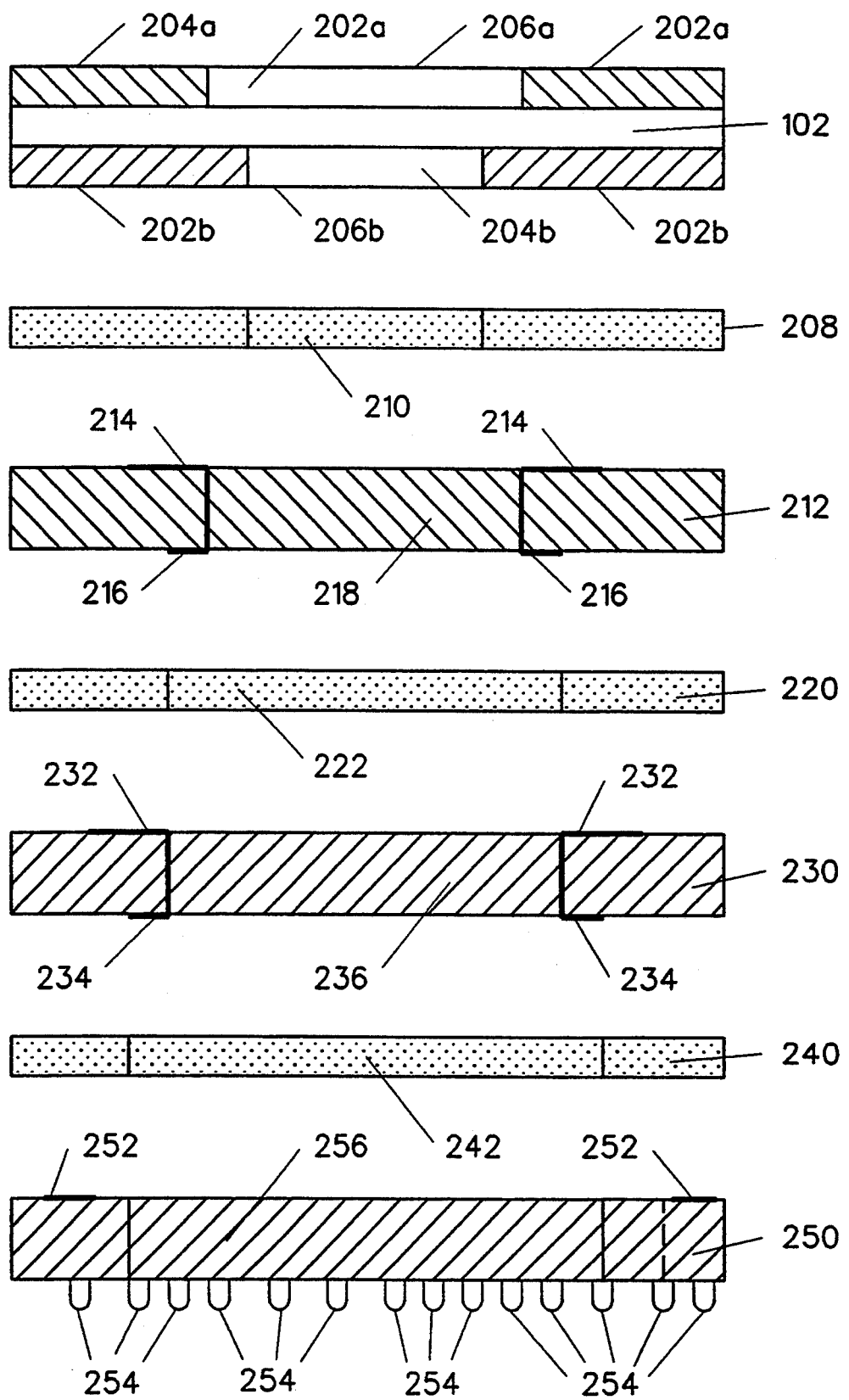
FIG. 2 is an exploded schematic cross section elevational view of an integrated circuit package according to a preferred embodiment of the invention.

Referring now to FIG. 2, an exploded schematic cross section elevational view of a semiconductor device assembly or integrated circuit package according to a preferred embodiment of the present invention is illustrated. Heat slug 102 has solder masks 202a and 202b deposited thereon. Metal plating 204a and 204b is plated or deposited onto the top and bottom faces of the heat slug 102, respectively. The solder masks 202a and 202b on the heat slug 102 allow for selectively metal plating the top and bottom faces 206a and 206b, respectively.

This plating may be metal such as, for example, nickel, nickel-gold, or gold. Gold is preferable for protecting the exposed area of the heat slug 102 from corrosion and as a thermal conductor. Passivation of the metal surface may also be utilized to prevent corrosion to the underlying metal. The metal plating 204a may be utilized for attachment of an external heat sink (see FIG. 7, heat sink 702). Metal plating 204b is utilized for attaching an integrated circuit die (see FIG. 3, die 302). Using gold for plating face 206b provides a non-oxidizing, non-corrosive surface that is advantageous for achieving a die attachment that has long term reliability. Using gold for plating face 206a provides a non-oxidizing, non-corrosive surface that does not adversely affect thermal performance of the heat slug 102.

Figure 3:
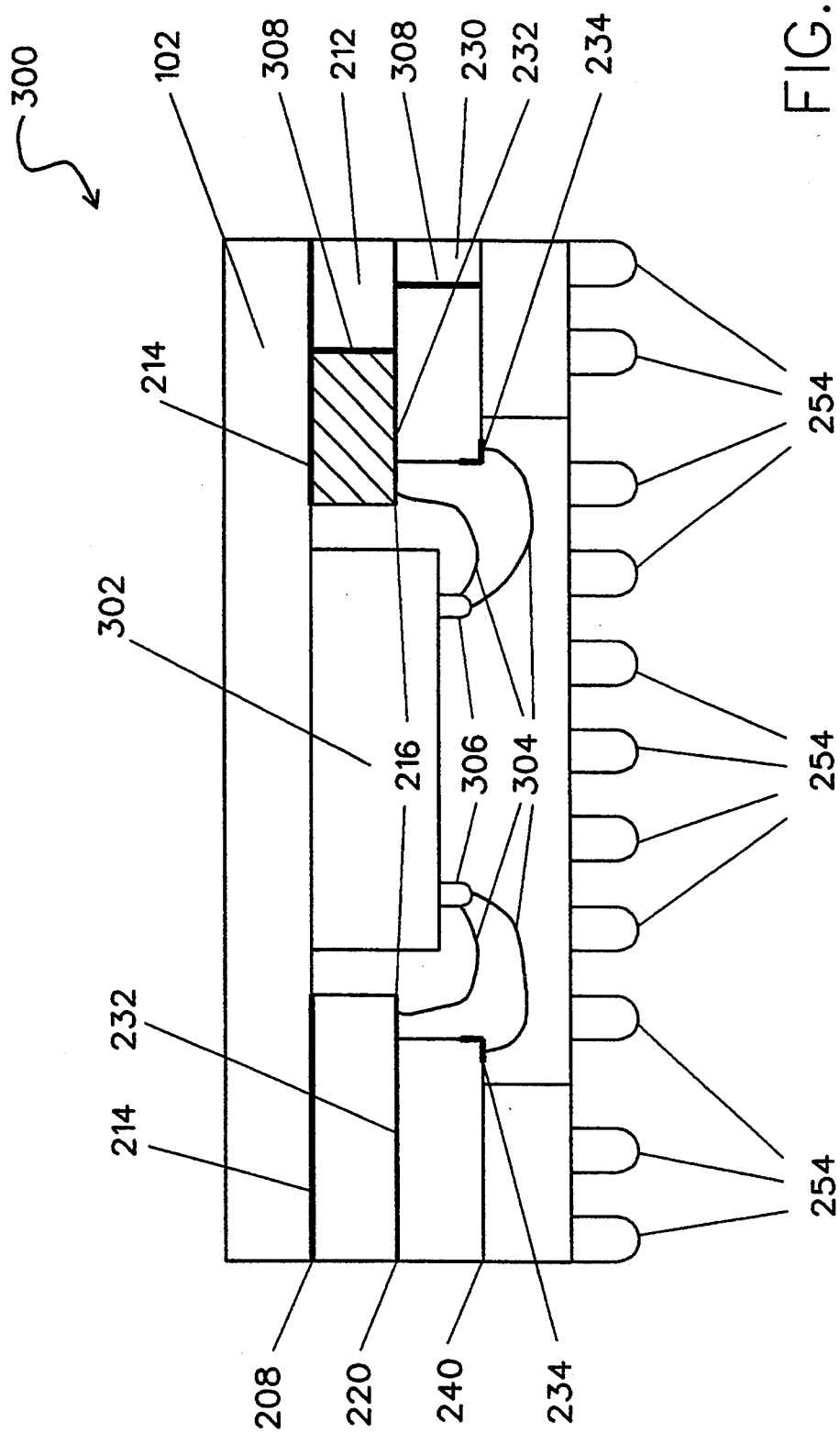
FIG. 3 schematic cross sectional elevational view of the embodiment illustrated in FIG. 2.

The solder mask 202 may be utilized to improve adhesion to a reinforced epoxy resin package laminate, resulting in increased reliability and mechanical integrity. Therefore, it is an advantage of the present invention to laminate a B-stage or prepreg layer 208 to the heat slug 102 solder mask 202b. Instead of or in addition to a solder mask, the face 206b may also be oxidized (black copper) to improve adhesion thereto as is well known in the art of fabricating integrated circuit packages. An opening 210 is formed in the prepreg layer 208 so that the metal plated 204b face 206b remains exposed for attachment of the integrated circuit chip 302 (FIG. 3). A printed wiring board (PWB) 212 having conductive paths 214 and contact pads 216 is laminated to the prepreg layer 208. Opening 218 matches up with the opening 210 for access to the face 206b.

Another prepreg layer 220 having an opening 222 is laminated to the PWB 212. Another PWB 230 having conductive paths 232 and contact pads 234 is laminated to the prepreg layer 220. Opening 236 matches with the opening 222 for access to the face 206b. Another prepreg layer 240 is used to attach the PWB 230 to PWB 250. Prepreg layer 240 has opening 242 for access to the face 206b.

The PWB 250 has conductive paths 252 and external connection means 254. The connection means 254 may be pins or solder balls as utilized in plastic pin grid arrays (PPGA) or plastic ball grid arrays (PBGA), respectively. The embodiment illustrated in FIG. 2 is a cavity down design. The cavity is formed by openings 210, 218, 236, 242 and 256. The die 302 is inserted into this cavity and attaches to the face 206b of the heat slug 102. An integrated circuit package is formed by laminating together heat slug 102, prepreg layers 208, 220 and 240; PWBs 212, 230 and 250. Any number of prepreg layers and PWBs may be utilized with the method and system of the present invention.

An advantage of the present invention is in utilizing the heat slug panel 100 as a stiffener to maintain coplanarity during lamination of the prepreg and PWB layers thereto. Thin prepreg and PWB layers may be utilized for increased package performance and improved interconnection routing. Interconnection between layer normally is by vias which are usually plated through holes. The via holes must be larger in diameter for thicker packages. Therefore, the package of the present invention facilitates a very thin package because the prepreg and PWB layers may be as thin as the technology allows because the stiffness and coplanarity may be substantially determined by the heat slug 102.

Referring now to FIG. 3, a cross section elevational view of an integrated circuit package 300 containing an integrated circuit die 302 is illustrated. The integrated circuit package 300 comprises the heat slug 102; PWBs 212, 230 and 250; prepreg layers 208, 220 and 240; and external connection means 254 laminated together to form an enclosing integrated circuit package 300. The die 302 is in close thermal communication with the heat slug 102 and may be attached thereto by any thermally conductive means as is well known in the art of fabricating integrated circuit packaging.

Connection of the integrated circuit die 302 is made by bond wires 304. The bond wires 304 connect the die 302 connection pads 306 to the PWB contact pads 216 and 234. The contact pads 216 and 234 are connected to conductive paths 214 and 232, respectively. The selected conductive paths between PWBs may be interconnected by means of vias which can be plated through holes 308. In addition, the vias 308 connect the circuits in the die 302 to the connection means 254. One skilled in the art of PWB integrated circuit package design would readily be able to design an interconnection system of the type illustrated in FIG. 3.

The PWB panel layers may be laminated together and each package assembly contained therein may be tested before the PWB panel layers are laminated to the heat slug panel 100. This allows pretesting of the laminated PWB panel for the purpose of functional screening. An overly defective laminated PWB panel may be discarded before attaching it to the heat slug panel 100.

An advantage of directly laminating the various layers in panels to the heat slug panel 100 is that the layers may be reasonably thin, resulting in an overall thin package. Either method of laminating results in a cost effective and easily implemented fabrication process for making integrated circuit packages such as, for example, PPGA, PBGA and gull wing packages.

Figure 4:
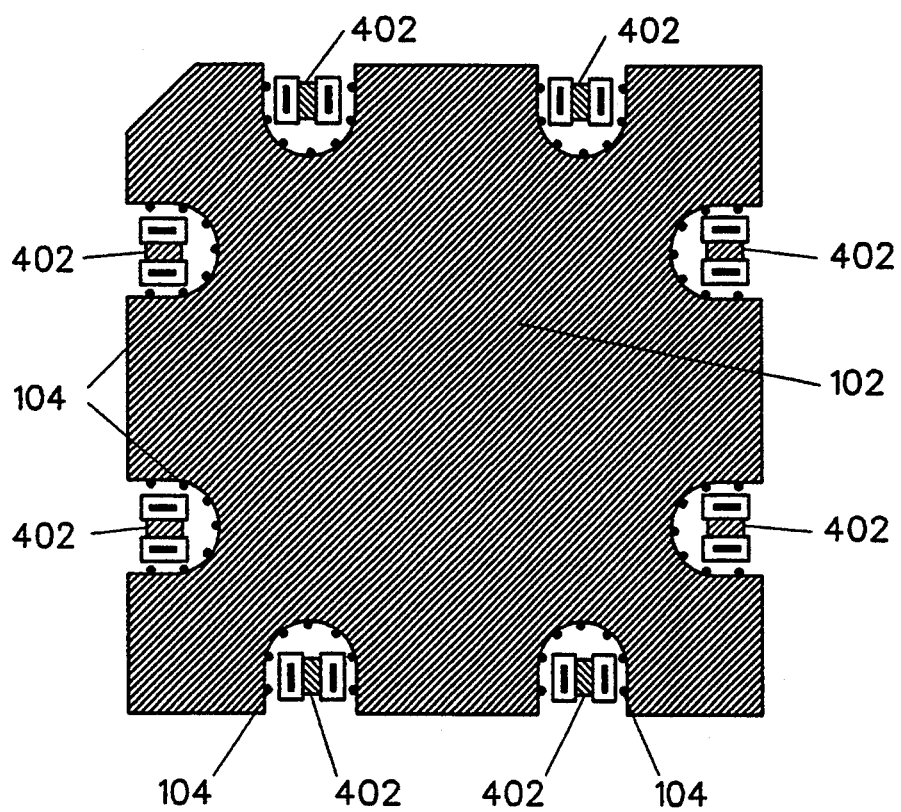
FIG. 4 is a schematic plan top view of an integrated circuit package according to an aspect of the invention.
Figure 5:
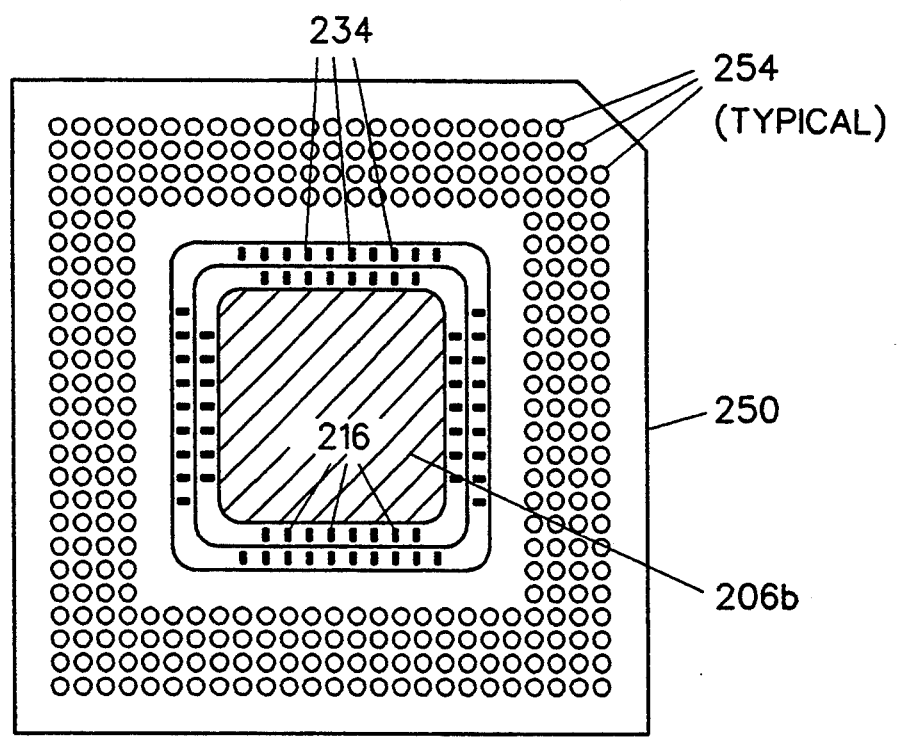
FIG. 5 schematic plan bottom view of the package of FIG. 4.

Referring now to FIGS. 4 and 5, schematic plan top and bottom views, respectively, of a preferred embodiment of an integrated circuit package are illustrated. The heat slug 102 having cut-outs 104 allows for the connection chip capacitors 402. The cut-outs 104 have an open side which facilitates removing solder flux after the step of soldering the capacitors 402 to selected PWB conductive paths such as, for example, conductive paths 214 (FIG. 2). The capacitors 402 may be used as decoupling and filter capacitors to reduce noise in the electronic system or prevent noise from effecting the integrated circuit electronics.

The bottom view of FIG. 5 illustrates heat slug 102 inner face 206b, contact pads 216 and 234, and external connection means 254. The die 302 is placed into the cavity and attached to face 206b. After the connections are made to the die 302, an epoxy encapsulation (not illustrated) fills in the cavity so as to protect the die 302 from contamination.

Figure 6:
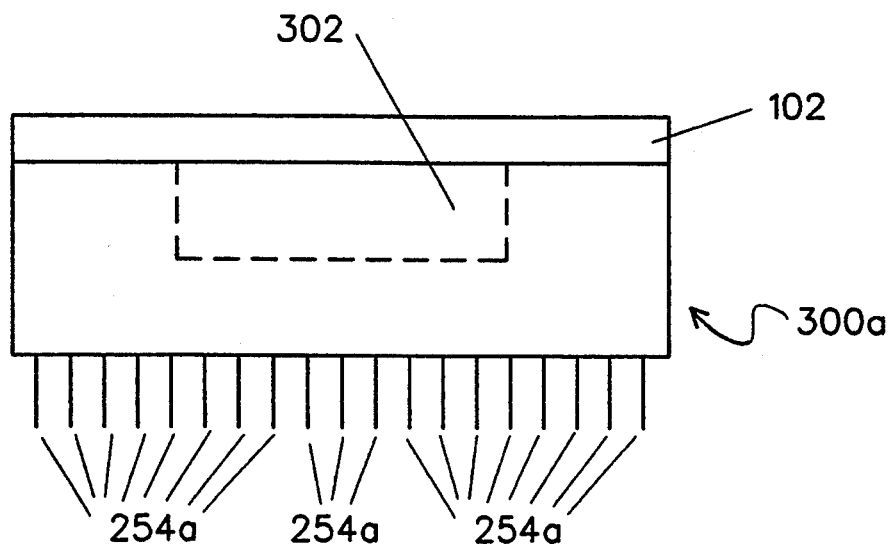
FIG. 6 is a schematic elevational view of an integrated circuit package according to another aspect of the invention.

Referring now to FIG. 6, a package having an encapsulated die 302 is illustrated in schematic elevational view. Heat slug 102 is at the top of the integrated circuit package 300a. The integrated circuit package 300a has external connection pins 254a. The integrated circuit package illustrated in FIG. 6 is sometimes referred to as a "cavity down" plastic pin grid array (PPGA) integrated circuit package.

Figure 7:
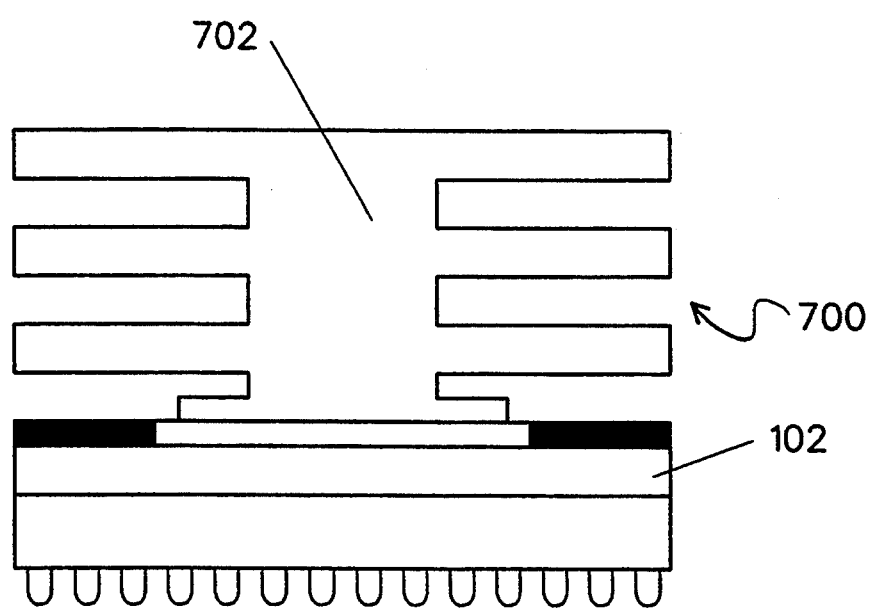
FIG. 7 is a schematic elevational view of an integrated circuit package having an external heat sink mounted to a package heat spreader.

Referring to FIG. 7, an external heat sink 702 is illustrated in schematic elevational view. The heat sink 702 is attached to the heat slug 102 so as to increase the thermal efficiency of the overall package 700. The heat sink 702 has more surface area to conduct the heat away from the die 302 attached to the heat slug 102. In this way high density power integrated circuits may be effectively cooled in the package of the invention.

Figure 8A:
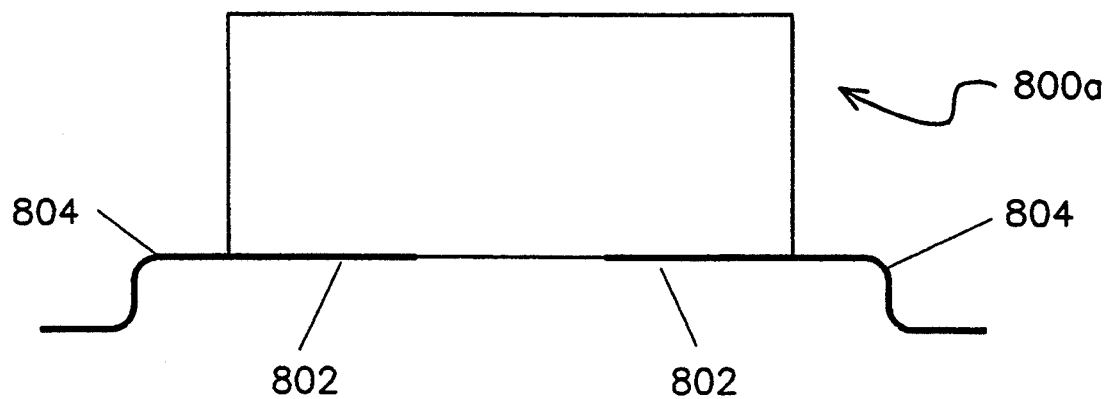
FIGS. 8a and 8b are schematic elevational views of integrated circuit packages according to yet another aspect of the invention.
Figure 8B:
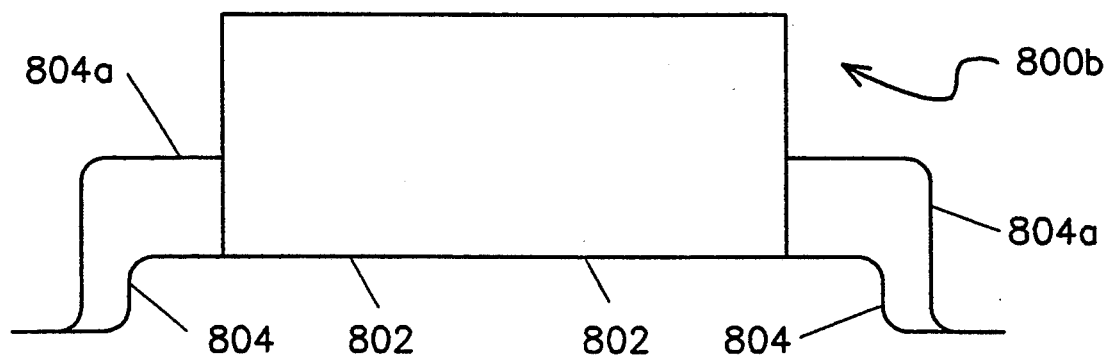

Referring now to FIGS. 8a and 8b, integrated circuit packages 800a and 800b according to preferred embodiments of the invention are illustrated in schematic elevational view. A lead frame-802 may be attached to or be part of one or more of the PWBs and shaped into a desired shape such as, for example, gull wings 804 and 804a. Many other types, configurations and shapes of integrated circuit packages and external connection leads thereof will be readily known to those skilled in the art of integrated circuit packages and may be easily adapted to the system and method of the present invention.

Accordingly, the system and method of the present invention, therefore, is well adapted to carry out the objects and attain the ends and advantages mentioned, as well as others inherent therein. While a presently preferred embodiment of the invention has been given for purposes of disclosure, numerous changes in the details of construction, interconnection and arrangement of parts will readily suggest themselves to those skilled in the art, and which are encompassed within the spirit of the invention and the scope of the appended claims.

What is claimed is:

1. A method for fabricating a plurality of integrated circuit packages from printed wiring board panels and a heat spreader laminated together, said method comprising the steps of:

(a) laminating a plurality of panels of printed wiring boards to a metal panel, forming the laminated printed wiring board panels a plurality of cavities for receiving integrated circuit dice having connection pads thereon, the printed wiring boards of the laminated panels having contact pads connected to a predetermined conductive path, and at least one of the printed wiring boards having external connection means connected to conductive paths other than said predetermined conductive paths;

(b) interconnecting related conductive paths connected to the contact pads of the printed wiring boards and the external connection means of said at least one printed wiring boards;

(c) placing an integrated circuit dice having connection pads thereon into each of said plurality of cavities;

(d) and attaching the integrated circuit dice connection pads to the respective printed wiring board contact pads; and (e) cutting sections of the metal panel and printed wiring board panels into individual integrated circuit packages.

2. The method of claim 1, wherein interconnecting step (b) is the step of plating vias between the related conductive paths.

3. A method for fabricating a plurality of integrated circuit packages from printed wiring board panels and a heat spreader laminated together, said method comprising the steps of:
   (a) attaching a plurality of laminated printed wiring board panels to a heat spreader metal panel, forming in the laminated printed wiring board panels a plurality of cavities for receiving integrated circuit dice having connection pads thereon, the laminated printed wiring board panels having contact pads connected to external connection means, the contact pads are to be connected to the integrated circuit dice connection pads, placing an integrated circuit dice having connection pads thereon in each of said plurality of cavities and connecting said connection pads pads are connected to the wiring board panel external connection means
   (b) cutting sections of the metal panel with the attached printed wiring board panels into individual integrated circuit packages wherein each of the packages has a heat spreader metal panel integral thereto.

4. The method of claim 3, further comprising before step (a) the step of testing the plurality of laminated printed wiring boards.

5. A system for fabricating a plurality of integrated circuit packages having heat spreaders integral thereto, comprising:
   a metal panel;
   a plurality of panels of printed wiring boards, the printed wiring board panels laminated to the metal panel, wherein the laminated printed wiring board panels forming a plurality of cavities for receiving integrated circuit dice having connection pads thereon and the printed wiring boards having conductive paths connected to contact pads, the contact pads are to be connected to the integrated circuit dice connection pads;
   means for external connection of the conductive paths of the laminated printed wiring boards to external connection means;
   a plurality of vias interconnecting related conductive paths between the printed wiring boards and the external connection means; and
   means for cutting sections of the metal panel laminated to the plurality of printed wiring board panels into individual integrated circuit packages.

6. The system of claim 5, wherein the external connection means is a pin grid array.

7. The system of claim 5, wherein the external connection means is a ball grid array.

8. The system of claim 5, wherein the external connection means is a lead frame assembly.

9. The system of claim 5, wherein the interconnecting vias are plated through holes.

* * * * *